United States Patent
Kitazawa

(10) Patent No.: US 7,126,268 B2
(45) Date of Patent: Oct. 24, 2006

(54) LIGHT-EMITTING DEVICE, IMAGE FORMING APPARATUS, AND DISPLAY APPARATUS

(75) Inventor: Takayuki Kitazawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/113,120

(22) Filed: Apr. 25, 2005

(65) Prior Publication Data

US 2006/0022600 A1   Feb. 2, 2006

(30) Foreign Application Priority Data

Jul. 27, 2004   (JP) .............................. 2004-218271
Feb. 25, 2005   (JP) .............................. 2005-050323

(51) Int. Cl.
*H01J 1/62* (2006.01)
(52) U.S. Cl. .................................... 313/500; 315/169.4
(58) Field of Classification Search ............ 315/169.1, 315/169.4, 160; 313/500–504; 345/76, 345/204
See application file for complete search history.

(56) References Cited

U.S. PATENT DOCUMENTS 7,026,754 B1 *   4/2006   Nakanishi .................... 313/500

2003/0214042 A1   11/2003   Miyazawa ................... 257/758

FOREIGN PATENT DOCUMENTS

JP   A-2003-316296   11/2003

\* cited by examiner

*Primary Examiner*—Wilson Lee
(74) *Attorney, Agent, or Firm*—Oliff & Berridge, PLC

(57) ABSTRACT

A light-emitting device has a plurality of data lines and a plurality of pixel circuits. Each of the plurality of pixel circuits includes a light-emitting element that has a first electrode and a second electrode and that emits light having an intensity depending on the amount of driving current; a driving transistor that supplies the driving current to the first electrode; a holding transistor that supplies a driving signal supplied via the data lines to the driving transistor; and a connecting line that connects the driving transistor to the holding transistor. The second electrode is formed in a region different from a region in which the data lines are formed such that the second electrode is not opposite to some or all of the data lines.

9 Claims, 14 Drawing Sheets

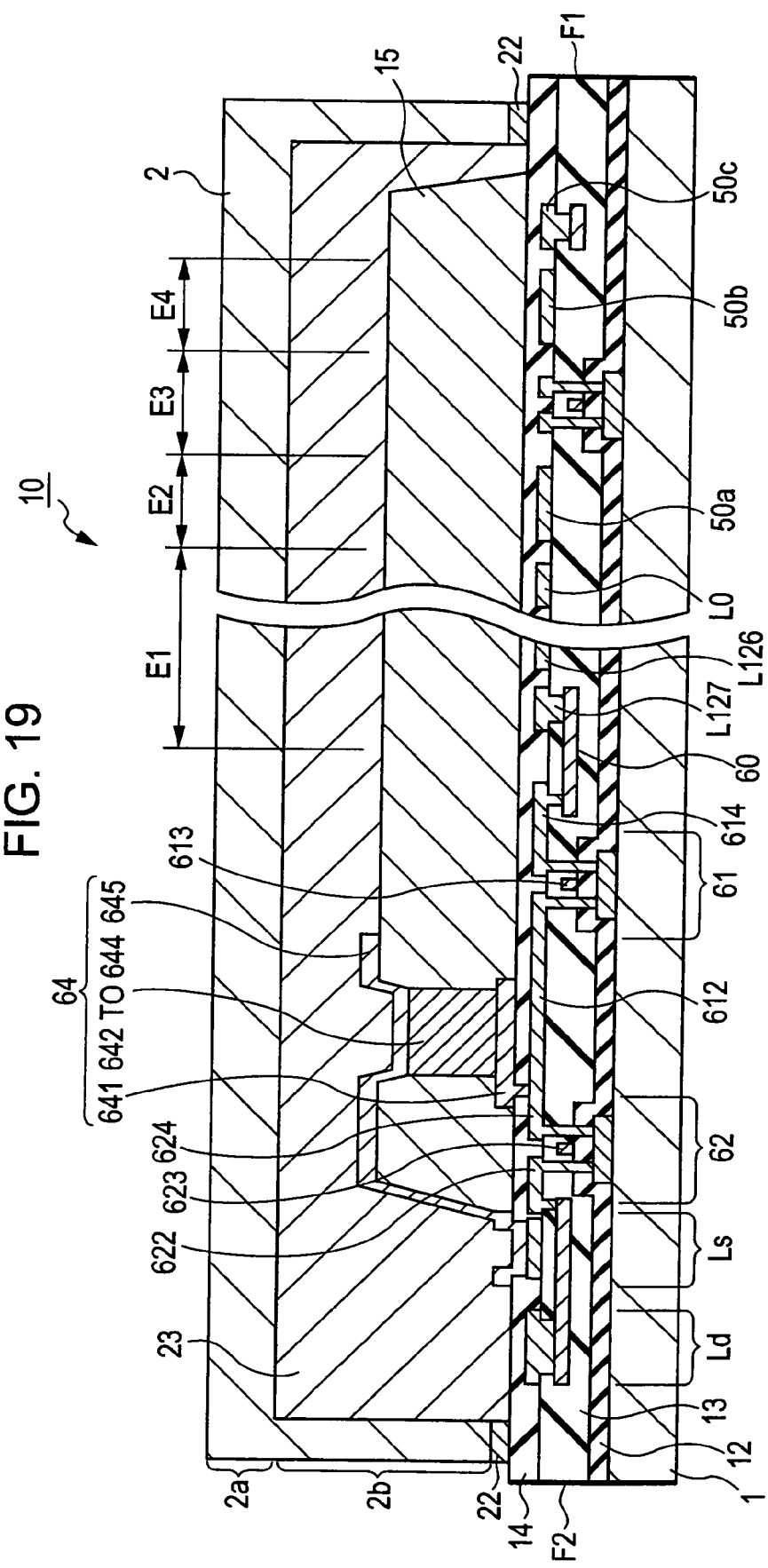

LIGHT-EMITTING DEVICE, IMAGE FORMING APPARATUS, AND DISPLAY APPARATUS

BACKGROUND OF THE INVENTION

1. Technical Field

The present invention relates to a light-emitting device using light-emitting elements for emitting light having an intensity depending on the amount of current flowing from an anode to a cathode, such as an organic light-emitting diode element, to an image forming apparatus, and to a display apparatus.

2. Related Art

In recent years, a great deal of attention has been paid to organic electroluminescent elements or organic light-emitting diode (OLED) elements, which are also called light-emitting polymer elements, as next-generation light-emitting devices replacing liquid crystal devices. Since the OLED element is a self-emitting type, a panel using the OLED element has a low dependency on a viewing angle, and moreover, since the OLED element does not require a backlight or reflected light, this element is suitable for a thin display device with low power consumption.

The OLED element is a current driven element that has no voltage retention, like the liquid crystal element, and cannot maintain a light emission state when a supply of a current thereto is disconnected. Accordingly, when the OLED element is driven by an active matrix method, it is common that a driving signal to indicate a gray-scale level of a pixel is supplied to a pixel circuit via a data line, a voltage is written in a gate electrode of a driving transistor by supplying a driving signal to the gate electrode in a write period via a holding transistor in the pixel circuit, the voltage is retained by a gate capacitor and the like, and the driving transistor continues to cause a driving current corresponding to the voltage to flow into the OLED element.

In such a light-emitting device, the OLED element has an anode coupled to the driving transistor, and a cathode opposite to the anode. On the other hand, the cathode is formed opposite to the data line and the holding transistor (for example, see Japanese Unexamined Patent Application Publication No. 2003-316296 (see FIGS. 2 and 3)).

However, when the cathode is opposite to the data line, a stray capacitance is produced between the cathode and the data line. The stray capacitance acts as a capacitive load from the point of view of a driving circuit for driving the data line. Accordingly, if the driving circuit has low driving capability, there is a problem in that it is difficult to write a voltage signal into the data line at high speed, and the brightness of the OLED element is lowered. On the other hand, even if a driving circuit having high driving capability is used a high load still needs to be driven and therefore, there is a problem in that power consumption is increased. In addition, since the stray capacitance is increased when the holding transistor is opposite to the cathode of the OLED element, there is the same problem as in the data line. Particularly, when an operation state of the driving transistor is controlled by supplying a driving signal having a preset pulse width to the driving transistor and the brightness of the OLED element is controlled by the preset pulse width, there arises a problem in that the driving signal having the preset pulse width is deteriorated due to the capacitive load, and thus, the desired brightness may not be obtained.

More particularly, when the light-emitting device is applied to a head unit of an image forming apparatus, since the OLED element is required to have high brightness because of sensitivity of a photoreceptor, there arises a significant problem of lack of write due to the stray capacitance. In addition, if the write period in a large display panel is short, there is also a significant problem of lack of write due to the stray capacitance.

SUMMARY

An advantage of the invention is that it provides a light-emitting device which is capable of preventing brightness from being lowered and reducing the power consumption by reducing stray capacitance, and an image forming apparatus and a display apparatus using the light-emitting device.

In order to achieve the above-mentioned object, according to an aspect of the invention, a light-emitting device includes a plurality of data lines, and a plurality of pixel circuits. Each of the plurality of pixel circuits includes a light-emitting element having a first electrode and a second electrode and emitting light having an intensity depending on the amount of driving current, a driving transistor for supplying the driving current to the first electrode, a holding transistor for supplying a driving signal supplied via the data lines to the driving transistor, and a connecting line for connecting the driving transistor to the holding transistor. The second electrode is formed in a region different from a region in which the data lines are formed such that the second electrode is not opposite to some or all of the data lines.

According to this invention, since the second electrode of the light-emitting element is not opposite to some or all of the data lines, a stray capacitance occurring between the second electrode and the data lines can be reduced. As a result, since a voltage of the data lines can be easily changed to have large amplitude, the brightness of the light-emitting element can be enhanced. In addition, since the capacitive load can be reduced, a driving circuit with low driving capability can be used and it becomes possible to reduce power consumption. In addition, from a point of view of the reduction of the stray capacitance, it is preferable to form the second electrode in a region different from a region in which the data lines are formed such that the second electrode is not opposite to all of the data lines. The light-emitting device is manufactured by forming a semiconductor layer, an interlayer insulating layer, electrodes, wiring lines and the like on a substrate. Accordingly, the data lines do not occupy the same region as the second electrode. Here, the term 'region' means a range in which objects (the second electrode and the data lines) are formed on the light-emitting device in plan view, for example, when reviewed in a direction perpendicular to the second electrode in plan view.

Particularly, if the second electrode is formed in a region different from a region in which the data lines are formed such that the second electrode is not opposite to all of the data lines, it is very suitable to an image forming apparatus in which the light-emitting device is used as a line head. On the other hand, if the second electrode is formed in a region different from a region in which the data lines are formed such that the second electrode is not opposite to some of the data lines, it is suitable to a display apparatus using the light-emitting device. In the display apparatus, pixel circuits are arranged in the form of a matrix at intersections of the plurality of scanning lines and a plurality of data lines. From a point of view of uniformity of brightness on the entire screen, potentials of cathodes of the pixel circuits are preferably maintained constant. To this end, second electrodes are connected one another to lower the total impedance. However, if the second electrode are arranged to cover the data lines, the stray capacitance occurs. So, it is preferable to form the second electrode such that it is not opposite to some of the data lines.

According to another aspect of the invention, a light-emitting device includes a plurality of data lines, and a plurality of pixel circuits. Each of the plurality of pixel circuits includes a light-emitting element having a first electrode and a second electrode and emitting light having an intensity depending on the amount of driving current, a driving transistor for supplying the driving current to the first electrode, a holding transistor for supplying a driving signal supplied via the data lines to the driving transistor, and a connecting line for connecting the driving transistor to the holding transistor. The second electrode is formed in a region different from a region in which the holding transistor is formed such that the second electrode is not opposite to the holding transistor.

According to this invention, since the second electrode of the light-emitting element is not opposite to some or all of the holding transistor, a stray capacitance occurring between the second electrode and the data lines can be reduced. As a result, since a voltage of the data lines can be easily changed to have large amplitude, the brightness of the light-emitting element can be enhanced. In addition, since the capacitive load can be reduced, a driving circuit with low driving capability can be used and it becomes possible to reduce power consumption.

Preferably, the second electrode is formed to be opposite to some or all of the connecting line. In this case, storage capacitance for retaining a driving signal can be formed by the stray capacitance occurring between the second electrode and the connecting line. Accordingly, since an especial structure for the storage capacitance is not required, a chip area can be reduced and a pitch between pixel circuits can be narrowed.

Preferably, a resistor element is formed in some of the connecting line, and the second electrode is formed such that the second electrode is opposite to some of the connecting line and is not opposite to the resistor element. From a point of view of elimination of noises, it is preferable to configure an integral circuit using the resistor element and the stray capacitance (occurring between the connecting line and the second electrode). If the resistor element is formed in a region in which the connecting line is opposite to the second electrode, a value of the capacitance is reduced. Accordingly, it is possible to form the storage capacitance efficiently by forming the resistor element in a region in which the connecting line is not opposite to the second electrode.

Preferably, the first electrode is an anode of the light-emitting element and the second electrode is a cathode of the light-emitting element. In this case, for example, it is preferable to configure the holding transistor with a P-channel TFT and the driving transistor with an N-channel TFT, supply a high potential-side power to the source of the driving transistor, connect the drain of the driving transistor to the anode of the light-emitting element, and supply a low potential-side power to the cathode of the light-emitting element.

Preferably, the light-emitting device further includes a power line for supplying power to the driving transistor, a substrate having a first section and a second section between which the plurality of data lines, the holding transistor, the light-emitting element, the driving transistor, and the power line are formed in order, and a sealing member connected to the substrate to cover the plurality of data lines, the holding transistor, the light-emitting element, the driving transistor, and the power line.

In general, performance of the light-emitting element is deteriorated when it is exposed to oxygen. On this account, the light-emitting device employs a sealing structure in order to intercept external air and protect an internal circuit. The sealing structure includes can sealing, thin film sealing, substrate laminating sealing structures, etc. However, in any case, actually, external gases intrude into the sealing structure. Accordingly, the light-emitting element is preferably formed in the vicinity of the center of the substrate. According to the invention, since the plurality of data lines, the holding transistor, the light-emitting element, the driving transistor, and the power line are formed in order on the substrate, the light-emitting element can be arranged in the vicinity of the center of the substrate. Accordingly, the reliability of the light-emitting device can be enhanced.

Preferably, the first electrode is an anode of the light-emitting element and the second electrode is a cathode of the light-emitting element, and the light-emitting device further includes a first power line for supplying a low potential-side power to the cathode, a second power line for supplying a high potential-side power to the driving transistor, a substrate having a first section and a second section between which the plurality of data lines, the holding transistor, the light-emitting element, the driving transistor, and the first and second power lines are formed in order, and a sealing member connected to the substrate to cover the plurality of data lines, the holding transistor, the light-emitting element, the driving transistor, and the first and second power lines. Since the cathode is apt to react with oxygen, it is preferable to arrange the cathode as close as possible to the center of the substrate. According to the invention, since the cathode is formed in the vicinity of the center of the substrate such that the cathode is not opposite to the holding transistor, the reliability of the light-emitting device can be further enhanced. In addition, since the first power line connected to the cathode is arranged closer to the center of the substrate and more apart from the second section than the second power line, the cathode can be formed even closer to the center of the substrate. Accordingly, the reliability of the light-emitting device can be further enhanced.

According to still another aspect, the invention provides an image forming apparatus including a photoreceptor on which an image is formed by irradiation of light, and a head unit for forming the image by irradiating light on the photoreceptor. The above-mentioned light-emitting device is used in the head unit. According to this invention, since the configuration of the head unit can be simplified, the configuration of the image forming apparatus can also be simplified, achieving miniaturization and light-weighting of the apparatus.

According to still another aspect, the invention provides a display apparatus including the above-described light-emitting device. Preferably, the display apparatus includes a plurality of scanning lines, a plurality of data lines, and a plurality of pixel circuits arranged at intersections of the scanning lines and the data lines. In this case, the display apparatus with high brightness can be achieved, the data line driving circuit with low driving capability can be used, and moreover, the power consumption can be reduced.

BRIEF DESCRIPTION OF THE DRAWINGS

The invention will be described with reference to the accompanying drawings, wherein like numbers reference like elements, and wherein:

FIG. 19 is a sectional view illustrating another example of a section of the light-emitting device of FIG. 17, taken along the line II—II of FIG. 17.

DESCRIPTION OF THE EMBODIMENTS

Hereinafter, exemplary embodiments of the present invention will be described with reference to the accompanying drawings.

Light-Emitting Device

Figure 1:
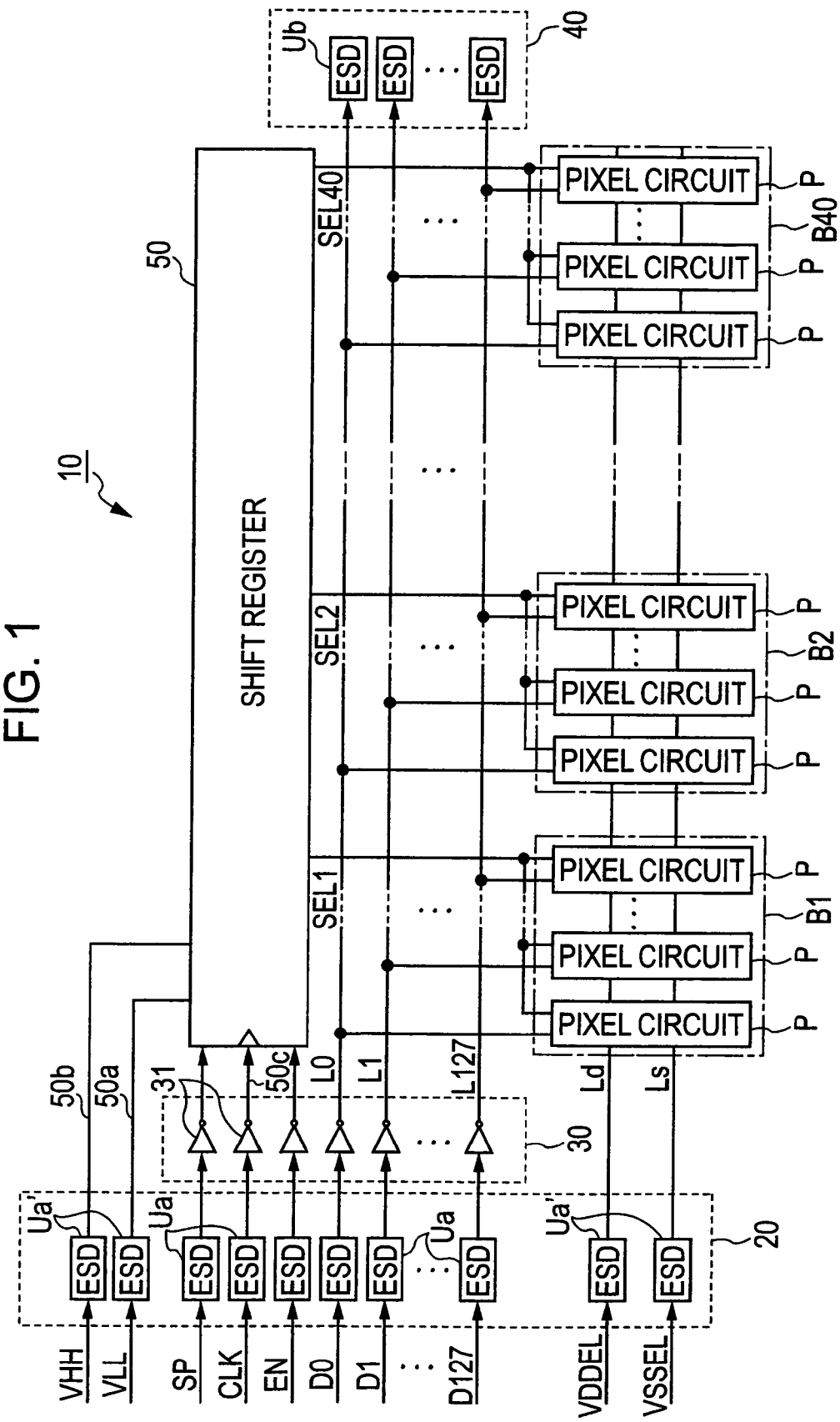
FIG. 1 is a block diagram illustrating the configuration of a light-emitting device according to the present invention.

FIG. 1 is a block diagram illustrating the configuration of a light-emitting device according to an embodiment of the invention. The light-emitting device is used as a head unit 10 of an image forming apparatus, such as a printer. The head unit 10 is a line-type optical head and includes an input protection circuit 20, a buffer unit 30, 128 data lines L0 to L127, an output protection circuit 40, a shift register 50, and a plurality of pixel blocks B1 to B40. The head unit 10 is supplied with various control signals and power signals in addition to data signals D0 to D127, and the input protection circuit 20 includes a plurality of input ESD protection units Ua arranged on wiring lines for supplying the control signals, and a plurality of inter-power protection unit Ua' arranged between a plurality of power supplies for supplying power signals. The control signals include a shift pulse signal SP, a clock signal CLK, and an enable signal EN. The buffer unit 30, which is composed of a plurality of inverters 31, serves as a driver for supplying the data signals D0 to L127 for the data lines L0 to L127, converts the impedance of the control signals to low impedance, and supplies the control signals having the low impedance to the shift register 50.

The shift pulse signal SP is a pulse that becomes active at a start of a main scan period, and the enable signal EN is a signal allowing an output of selection signals SEL1 to SEL40 outputted from the shift register 50. The shift register 50 is supplied with power supply voltage signals VHH and VLL. The power supply voltage signal VHH is supplied via a wiring line 50b and the power supply voltage signal VLL is supplied via a wiring line 50a. When the enable signal EN is active, the shift register 50 shifts the shift pulse signal SP according to the clock signal CLK and outputs the selection signals SEL1 to SEL40 in turn. Each of the selection signals SEL1 to SEL40 becomes active in ¹⁄₄₀ of the main scan period. In addition, the clock signal CLK is supplied to the shift register 50 via a wiring line 50c.

The first to fortieth pixel blocks B1 to B40 are exclusively selected in turn by the selection signals SEL1 to SEL40. In this way, since the main scan period is divided into a plurality of select periods (write periods) for time division driving, the number of data lines L0 to L127 may be reduced. Each of the first to fortieth pixel blocks B1 to B40 has 128 pixel circuits P corresponding to the data lines L0 to L127, respectively. These pixel circuits P are supplied with power supply voltage signals VDDEL and VSSEL. While the power supply voltage signal VDDEL at a high-potential side is supplied via a power line Ld, the power supply voltage signal VSSEL at a low-potential side is supplied via a power line Ls. In addition, the data signal D0 to D127 supplied via the data lines L0 to L127 are received in the pixel circuits P in each select period. In addition, in this embodiment, the data signals D0 to D127 are binary signals indicating lighting on/off of the OLED element.

Figure 2:
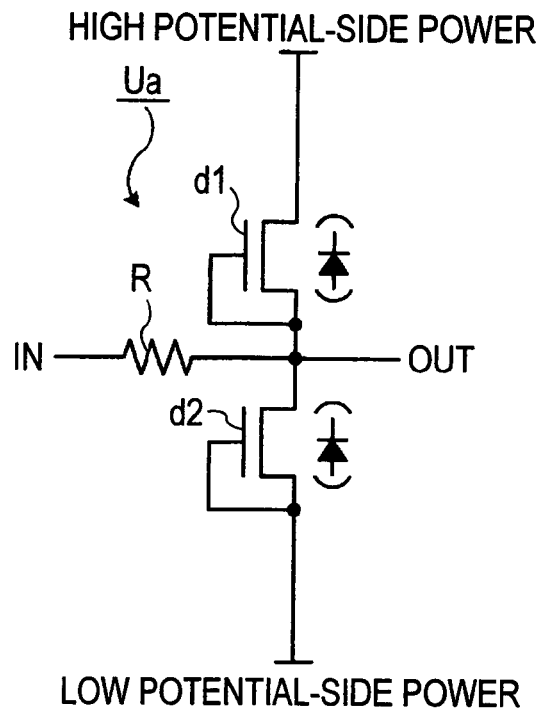
FIG. 2 is a circuit diagram of an input ESD protection unit of the light-emitting device of FIG. 1.
Figure 3:
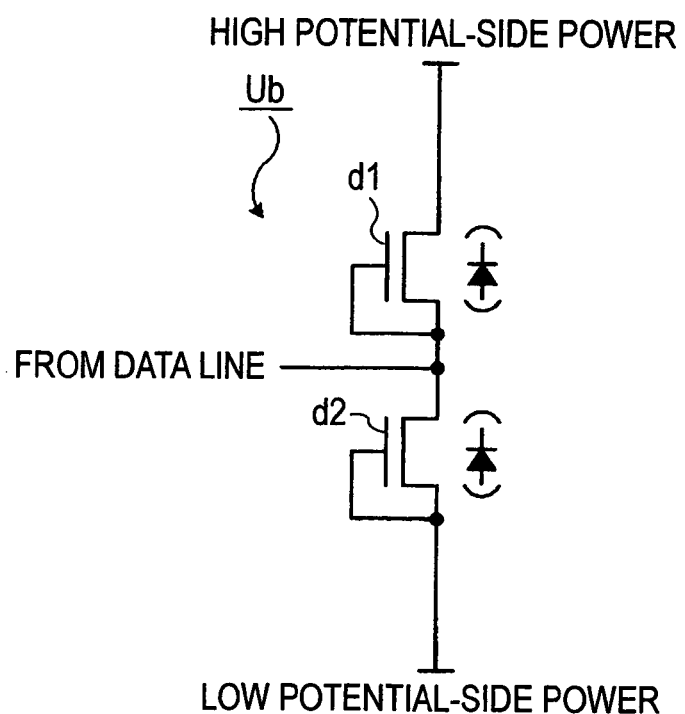
FIG. 3 is a circuit diagram of an output ESD protection unit of the light-emitting device of FIG. 1.

FIG. 2 is a circuit diagram of the input ESD protection unit Ua used in the input protection circuit 20, and FIG. 3 is a circuit diagram of an output ESD protection unit Ub used in the output protection circuit 40. Each of the input ESD protection unit Ua and the output ESD protection unit Ub has diodes d1 and d2 connected in series between a high potential-side power and a low potential-side power, and the input ESD protection unit Ua has also a resistor R. In addition, the inter-power protection units Ua' are configured by diodes connected reversely between power wiring lines. The reason for providing the protection circuits for electrostatic discharge (ESD) at both the input ports and output ports of the data lines L0 to L127 is that the length of the data lines L0 to L127 is about 215 mm to allow the head unit 10 of this example to cope with an A4 lengthwise print size. This is true of providing the protection circuits for electrostatic discharge at a power side. In addition, the reason for providing the buffer unit 30 is that, since the input ESD protection unit Ua has the resistor R, delay time of signals is increased if the unit Ua is driven externally without the buffer unit 30.

Figure 4:
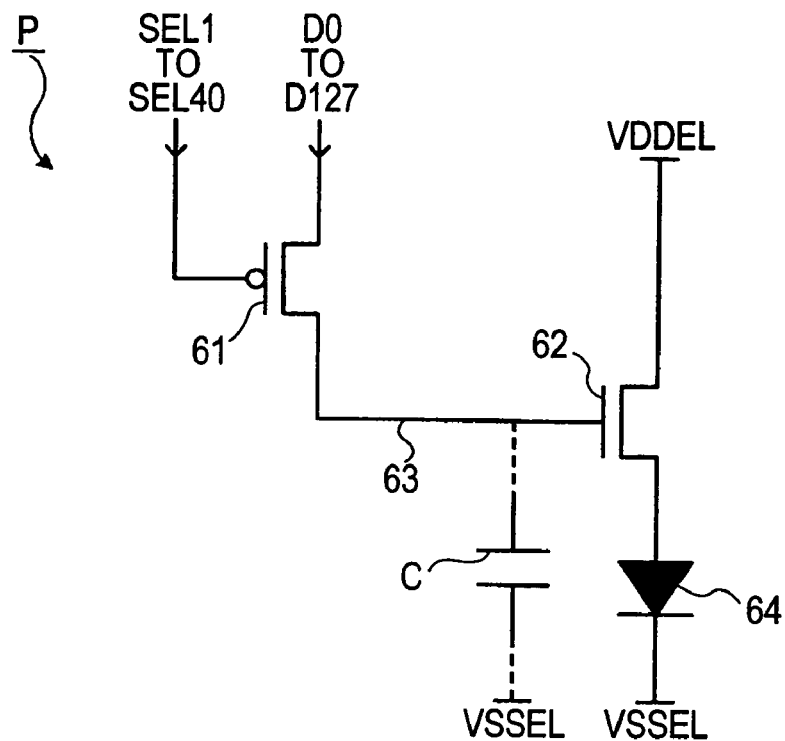
FIG. 4 is a circuit diagram of a pixel circuit in the light-emitting device of FIG. 1.

FIG. 4 is a circuit diagram of one pixel circuit P. The pixel circuit P includes a holding transistor 61, a driving transistor 62, and an OLED element 64. The holding transistor 61 has a gate supplied with one of the selection signals SEL1 to SEL40 from the shift register 50 and a source connected to one of the data lines L0 to L127 and supplied with one of the data signals D0 to D127. A drain of the holding transistor 61 is connected to a gate of the driving transistor 62 via a connecting line 63. As will be described later, the connecting line 63 has associated stray capacitance acting as storage capacitance C. In the storage capacitance C, a voltage assuming one of two values is written in a select period and is retained until the next select period. Accordingly, in a period when the holding transistor is selected by the selection signals SEL1 to SEL40, the OLED element 64 emits light during only a period when the data signals D0 to D127 are signals indicating lighting-on of the OLED element 64.

Figure 5:
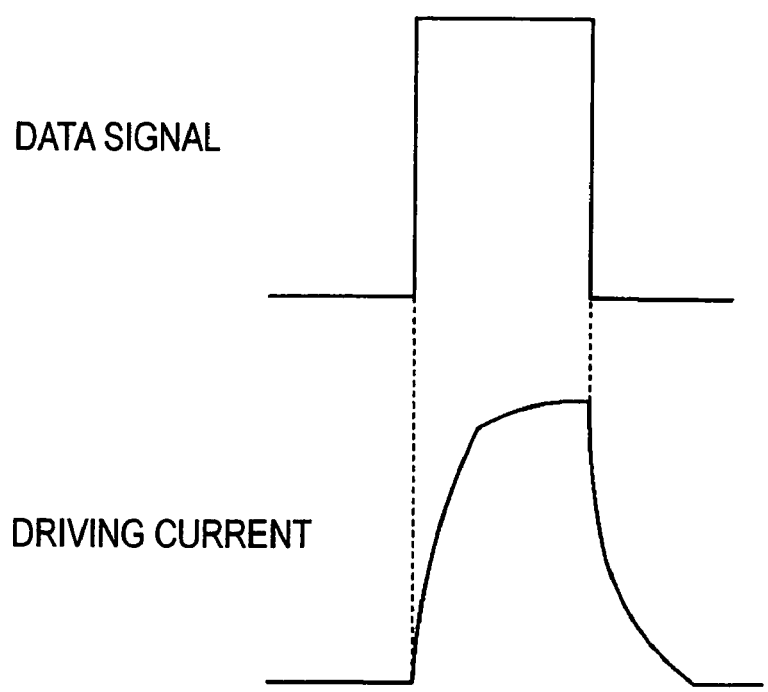
FIG. 5 is a waveform diagram showing a relationship between a data signal and a driving current.

The driving transistor 62 has a drain supplied with the power supply voltage VDDEL and a source connected to an anode of the OLED element 64. The driving transistor 62 supplies a driving current depending on the voltage written in the storage capacitance C to the OLED element 64. The OLED element 64 has a cathode supplied with the power supply voltage VSSEL. The OLED element 64 emits light having an intensity depending on the amount of driving current. In the pixel circuit P of this embodiment, the holding transistor 61 is configured by a P-channel thin film transistor (TFT) and the driving transistor 62 is configured by an N-channel TFT. Since the P-channel transistor has excellent current absorption, a rising waveform of the driving current is steep and a falling waveform of the driving current is smooth, as shown in FIG. 5. As a result, although a gray-scale characteristic at a low gray-scale level of the OLED element 64 is deteriorated, the peak brightness may be increased. Since the sensitivity of a photoreceptor is generally low, it is important to increase the peak brightness. On the other hand, when the OLED element 64 emits light with an intensity corresponding to a current in the vicinity of a threshold current, there is no adverse effect on image quality since the sensitivity of the photoreceptor is very low. Accordingly, considering the peak brightness first, it is preferable to configure the holding transistor 61 with the P-channel transistor and the driving transistor 62 with the N-channel transistor.

Figure 6:
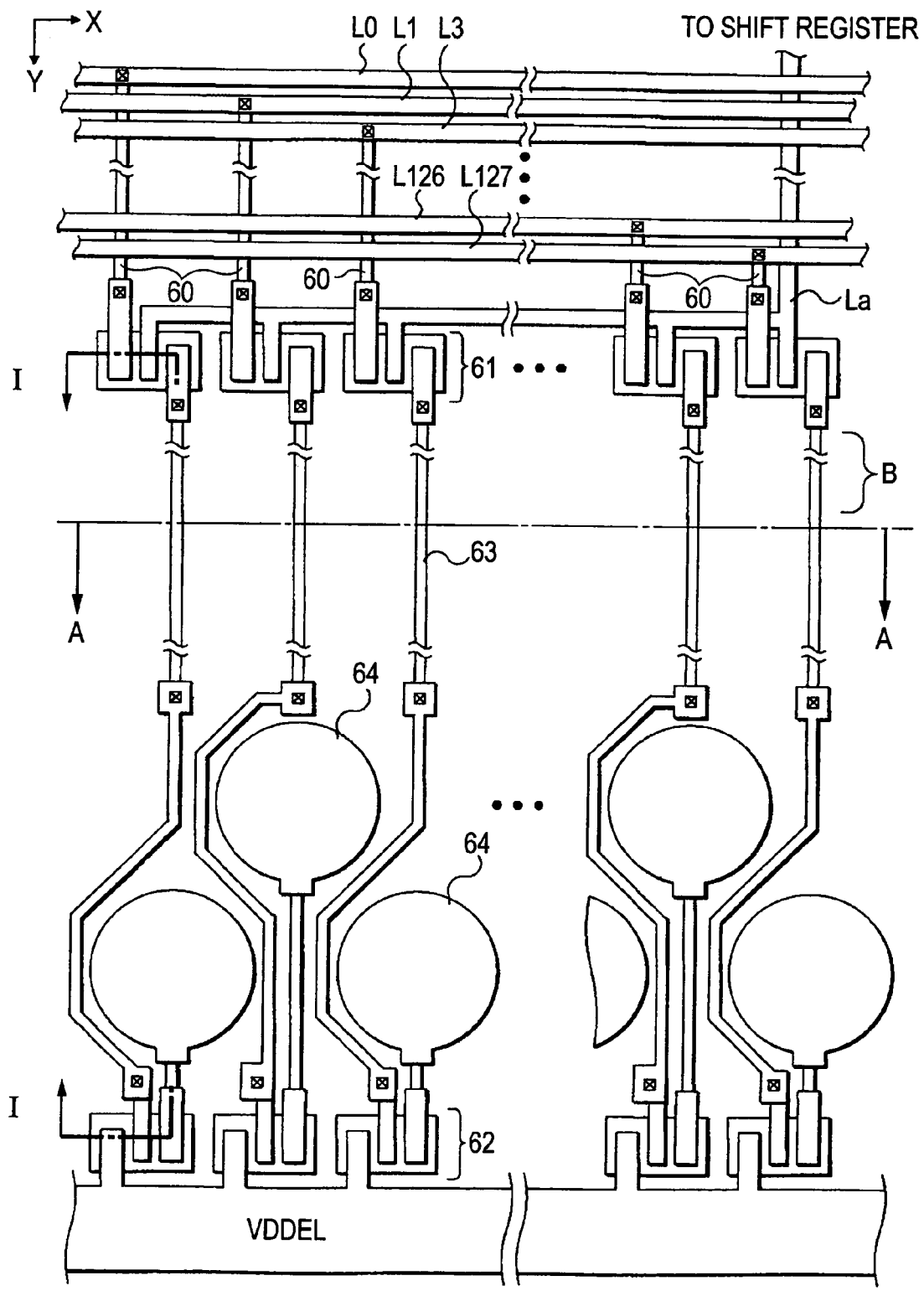
FIG. 6 is a plan view illustrating a pixel block and a wiring line structure of a data line.

FIG. 6 shows a pixel block and a wiring line structure of the data lines. As shown in the figure, the data lines L0 to L127 are arranged in parallel along an X direction (indicated in the figure), and pixel circuits P each including the holding transistor 61, the driving transistor 62, the connecting line 63, and the OLED element 64 are arranged in a Y direction (indicated in the figure). Gates of holding transistors 61 are connected in common by a wiring line La and are connected to the shift register 50. The data lines L0 to L127 are formed using a source line. A connecting line 60 using a gate line is used for connection between each holding transistor 61 and each data line L0 to L127. The OLED elements 64 are arranged in a zigzag fashion between the holding transistors 61 and the driving transistors 62. In this manner, since the OLED elements 64 are arranged in the zigzag fashion, a pitch between the pixel circuits P can be made narrow, and thus, images can be formed with high resolution.

Figure 7:
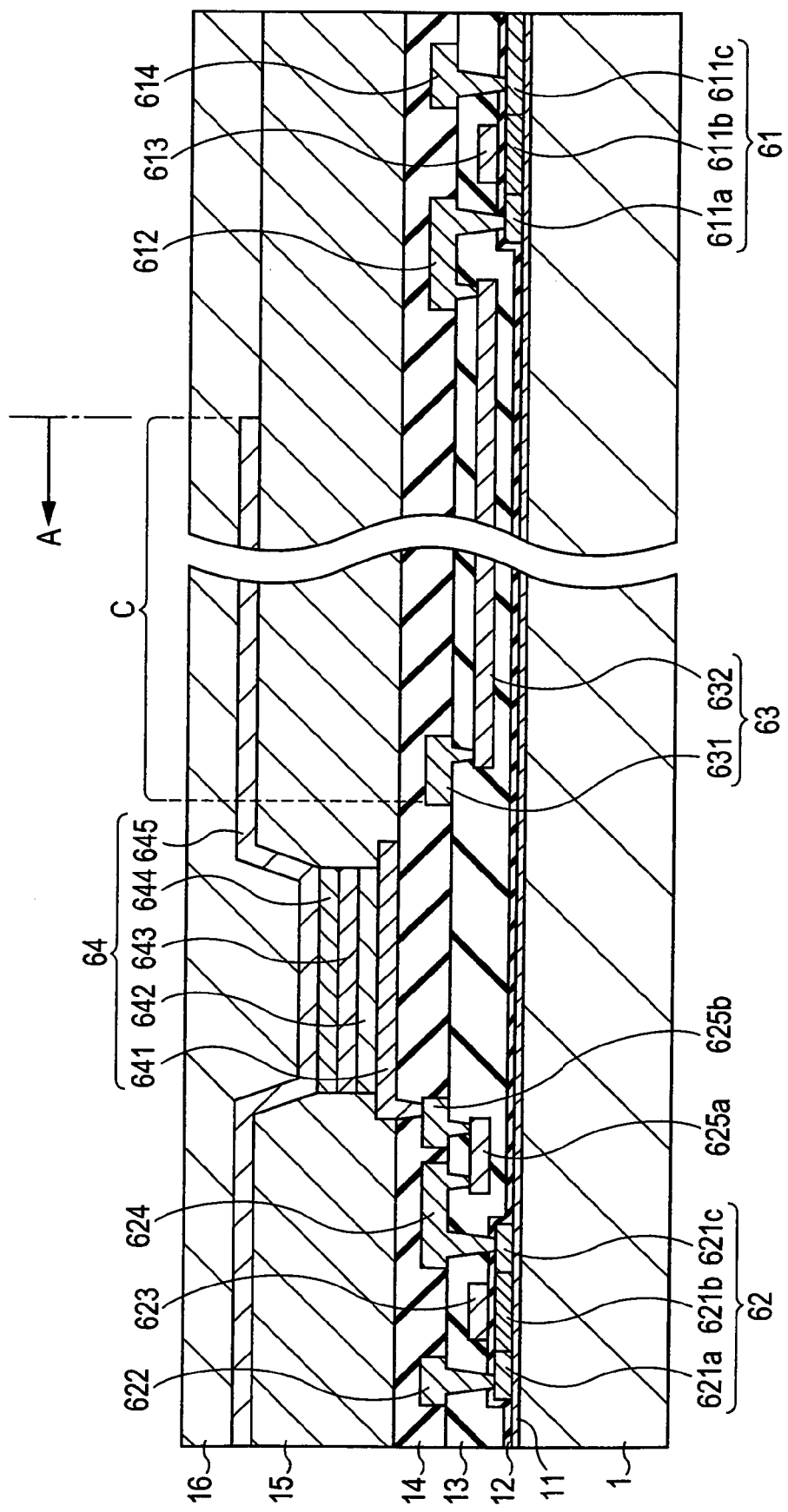
FIG. 7 is a sectional view taken along the line I—I of FIG. 6.

FIG. 7 is a sectional view taken along the line I—I of FIG. 6. The driving transistor 62 is formed on a surface of a substrate 1 via a base protection layer 11 having $SiO_2$ as a main component. A silicon layer 621 is formed on the base protection layer 11. Accordingly, the driving transistor 62 becomes an N-channel transistor. A gate insulating layer 12 is also formed on the base protection layer 11 to cover the silicon layer 621. A gate electrode 623 is formed on a portion of the top surface of the gate insulating layer 12 opposite to the silicon layer 621. V group element is doped into the silicon layer 621 via the gate electrode 623 to form a drain region 621a and a source region 621c. Here, a region into which the V group element is undoped becomes a channel region 621b. A first interlayer insulating layer 13 is formed on the gate insulating layer 12 to cover the gate electrode 623. In addition, a drain electrode 622 is connected to the drain region 621a via a contact hole passing through the gate insulating layer 12 and the first interlayer insulating layer 13.

On the other hand, a source electrode 624 is formed at a location opposite to the drain electrode 622 with the gate electrode 623 interposed therebetween and is connected to the source region 621c via a contact hole passing through the gate insulating layer 12 and the first interlayer insulating layer 13. A second interlayer insulating layer 14 is formed on the first interlayer insulating layer 13 to cover the drain electrode 622 and the source electrode 624.

In a similar manner, the holding transistor 61 has a silicon layer 611, the gate insulating layer 12, a gate electrode 613, the first interlayer insulating layer 13, a first drain/source electrode 612, and a second drain/source electrode 614. However, a group-III element is doped into the silicon layer 611 via the gate electrode 613 to form a first drain/source region 611a and a second drain/source region 611c. Here, a region into which the group-III element is undoped becomes a channel region 611b. The holding transistor 61 becomes a P-channel transistor.

In addition, the gate electrode 623 of the driving transistor 62 is connected to the first drain/source electrode 612 of the holding transistor 61 via the connecting line 63. The connecting line 63 of this example is composed of a first wiring line 631 and a second wiring line 632 (see FIG. 7). The first wiring line 631 is formed using a wiring line formed in the same layer as the first drain/source electrode 612 and second drain/source electrode 614 of the holding transistor 61 and the drain electrode 622 and source electrode 624 of the driving transistor 62, and the second wiring line 632 is formed using a wiring line formed in the same layer as the gate electrodes 623 and 613.

The OLED element 64 includes an anode 641, a hole transport layer 642 for transporting holes, a light-emitting layer 643 including an organic EL material having light emission capability, an electron transport layer 644 formed on the light-emitting layer 643, and a cathode 645 formed on the electron transport layer 644. The anode 641 is connected to the source electrode 624 of the driving transistor 62 via a wiring line 625a and a wiring line 625b. In addition, a partition wall 15 made of a synthetic resin and the like is formed between the cathode 645 and a portion of a surface of the first interlayer insulating layer 13 other than a portion where the OLED element 64 is formed. In addition, the partition wall 15 is formed to isolate the OLED elements 64 from one another, which are formed at each driving transistor 62. The anode 641 serves to supply holes to the light-emitting layer 60 and is formed using a transparent conductive material such as indium tin oxide (ITO) and an indium oxide/zinc oxide family amorphous transparent conductive film (Indium Zinc Oxide: IZO®). The anode 641 may include alloys of the above-mentioned materials or a stack thereof. The cathode 645 is made of a metal element having a low work function (for example, an alkali metal, an alkali earth metal, magnesium, a rare earth element (excluding Pm), aluminum, etc.) in order to increase electron injection efficiency. In addition, the cathode 645 is preferably made of a light reflective or opaque conductive material. Although this example shows a configuration where light from the light-emitting layer 643 is ejected through the anode 641 (a bottom emission type), a configuration where light is ejected through the cathode 645 (a top emission type) may be properly employed.

Here, the cathode 645 is formed to cover not the entirety but only a portion of the partition wall 15. Specifically, the cathode 645 is formed in a region indicated by an arrow A shown in FIGS. 6 and 7, not in a region in which the data lines L0 to L127 and the holding transistor 61 are formed. In this manner, the data lines L0 to L127 and the holding transistor 61 are formed such that they do not overlap with the cathode 645 in order to reduce the stray capacitance. The data lines L0 to L127 are formed in the same manufacturing process as the first drain/source electrode 612 and second drain/source electrode 614 of the holding transistor 61 and the drain electrode 622 and source electrode 624 of the driving transistor 62. Accordingly, if the cathode 645 covers the entire surface of the second insulating layer 14, stray capacitance is produced between the cathode 645 and the data lines L0 to L127. Since the light-emitting device according to this embodiment is used as the head unit 10 of the printer, the length of the data lines L0 to L127 is long, and thus, accompanying stray capacitance is large. Thus, the load when viewed from the buffer unit 30 becomes large. Therefore, the cathode 645 is not formed in the region of the data lines L0 to L127. Accordingly, it is possible to reliably write the data signals D0 to D127 during a limited select period, and moreover, significantly reduce the delay time of the data signals D0 to D127.

On the other hand, since the cathode 645 is opposite to a portion of the connecting line 63, stray capacitance is produced therebetween. The storage capacitance C is formed by the stray capacitance. In the select period, the holding transistor 61 is turned on and a data signal is written in the storage capacitance C. Even when the holding transistor 61 is turned off at an end of the select period, a voltage of the data signal is retained in the storage capacitance C. Accordingly, the driving transistor 62 can supply a current to the OLED element 64 during even a preset period from an end of one select period to the start of the next select period. In addition, although the cathode 645 is opposite to the portion of the connecting line 63 in this example, the amount of overlap therebetween depends on the value of the storage capacitance C determined by the length of a retention period and the like. Accordingly, the cathode 645 may be opposite to the entirety of the connecting line 63.

In addition, a resistor element may be arranged on the connecting line 63 in order to remove noise. In this case, the resistor element is preferably formed in a region B shown in FIG. 6. That is, the resistor element is arranged in a region in which the connecting line 63 is not opposite to the cathode 645. If the resistor element is formed in a region A where the connecting line 63 is opposite to the cathode 645, the value of the storage capacitance C is reduced. So, by forming the resistor element in the region where the connecting line 63 is not opposite to the cathode 645, it becomes possible to form the storage capacitance C efficiently. Particularly, the operation state of the driving transistor 62 can be controlled by supplying a driving signal having a specific pulse width, and, in a case of a sub-frame or pulse width modulation driving system for controlling the brightness of the OLED element 64 using the specific pulse width, the OLED element 64 can emit light with a specific brightness without any deterioration of the driving signal by reducing a capacitive load using the invention.

Figure 17:
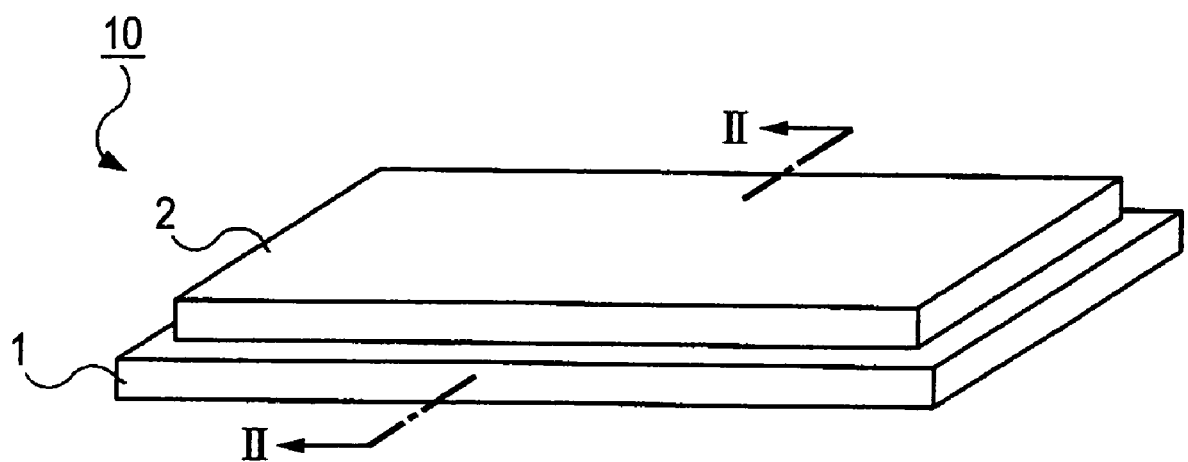
FIG. 17 is a perspective view illustrating an external configuration of the light-emitting device.
Figure 18:
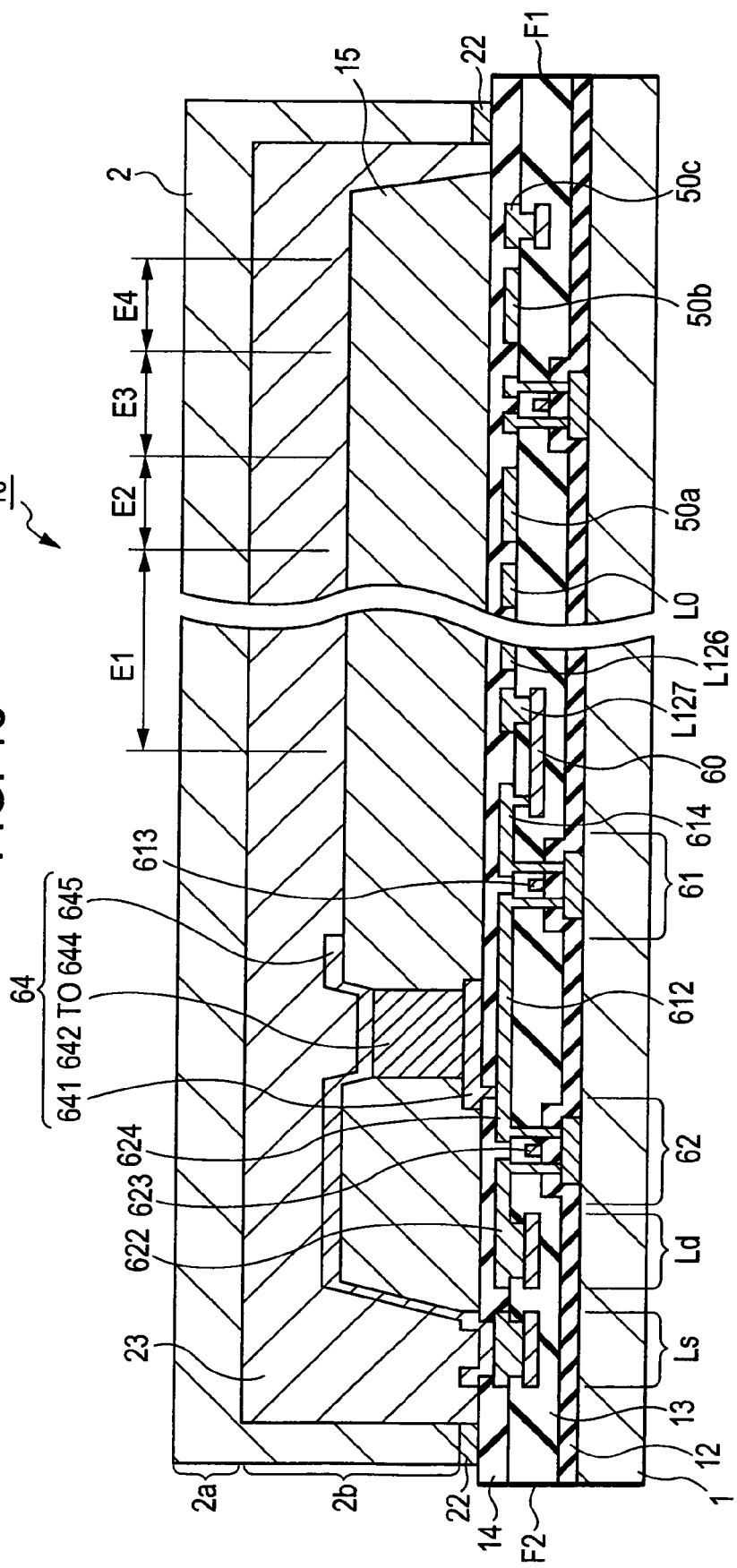
FIG. 18 is a sectional view illustrating an example of a section of the light-emitting device of FIG. 17, taken along the line II—II of FIG. 17.

FIG. 17 shows an external configuration of the head unit 10. In this example, the head unit 10 (light-emitting device) includes a substrate 1 and a sealing member 2 formed on the substrate 1. FIG. 18 is a sectional view illustrating an example of a section of the head unit 10, taken along the line II—II of FIG. 17. The data lines L0 to L127 are formed in a region E1 shown in FIG. 18. The wiring line 50*a* for supplying the power supply voltage signal VLL at the low-potential side is formed in a region E2. A data line driving circuit 50 is formed in a region E3. The wiring line 50*b* for supplying the power supply voltage signal VHH at the high-potential side is formed in a region E4.

As shown in FIG. 18, the substrate 1 has a first section F1 and a second section F2. In addition, on the substrate 1 are arranged the data line driving circuit 50, the data lines L0 to L127, the holding transistor 61, the OLED element 64, the driving transistor 62, the power line Ld, and the power line Ls in order between the first section F1 and the second section F2. In addition, the sealing member 2 is connected to the substrate 1 to cover the data line driving circuit 50, the data lines L0 to L127, the holding transistor 61, the OLED element 64, the driving transistor 62, the power line Ld, and the power line Ls. As shown in FIG. 18, the sealing member 2 includes a plate part 2*a* and a frame part 2*b*. The plate part 2*a* is formed at a position opposite to the OLED element and the like formed on the substrate 1. The frame part 2*b* is bonded to the substrate 1 via an adhesive agent 22. In addition, the substrate 1 is bonded to the sealing member 2 through only the frame part 2*b* and a sealing space 23 is defined between the OLED element 64 formed on the substrate 1 and the plate part 2*a*. Inside the sealing space 23 are sealed inert gases such as dry nitrogen, or liquid in order to prevent the light-emitting layer 60 or the cathode 645 and the like from being deteriorated due to oxygen or water. In addition, a desiccant agent and the like may be placed in the sealing space 23. This example employs so-called can sealing. Alternatively, thin film sealing or substrate laminating sealing may be employed. In the thin film sealing, on the OLED element 64 may be formed, for example, a thin film, such as a silicon oxide or a silicon nitride, formed by a chemical vapor deposition (CVD) method, as the sealing member 2. In the substrate laminating sealing, for example, the substrate 1 may be bonded to a substrate such as glass as the sealing member 2 via an adhesive agent applied on the OLED element 64. Here, the substrate 1 is bonded to the sealing member 2 in a portion where an organic material such as the partition wall 15 is not formed. In this way, oxygen or water from the outside can be prevented from intruding into the sealed space.

The light-emitting layer 643 of the OLED element 64 is configured to include a luminescent material such as a conductive polymer or monomer. This luminescent material is apt to be oxidized and has a characteristic deteriorated when the material is exposed to oxygen. In addition, a material having a low work function is selected as the cathode 645 in order to inject electrons into the material. Since such a material contains, for example, calcium, a hydroxide film is apt to be formed as the calcium reacts with water intruding from the outside. If the hydroxide film is formed, there is a difficulty in injecting electrons into the material.

The sealing member 2 serves to protect the interior of the head unit 10 from external air and has a function of intercepting gases. However, in the case of the can sealing or the substrate laminating sealing, some gas, although a little, may intrude from the adhesive bonding the sealing member 2 to the substrate 1 into the interior of the head unit 10. In addition, in the case of the thin film sealing, some gas, although a little, may intrude from an interface between the sealing member 2 and the substrate 1 into the interior of the head unit 10. Accordingly, the OLED element 64 and the cathode 741, which are susceptible to gases, are preferably arranged as far as possible from the first and second sections F1 and F2 of the substrate.

In the arrangement of FIG. 18, the OLED element 64 is arranged between the holding transistor 61 and the driving transistor 62, the data lines L0 to L127 and the data line driving circuit 50 are arranged between the holding transistor 61 and the first section F1, and the power lines Ld and Ls are arranged between the driving transistor 62 and the second section F2. Accordingly, the OLED element 64 can be arranged in the vicinity of the center of the substrate, which may result in improvement of reliability of the head unit 10.

In addition, since the cathode 645 is not arranged in the holding transistor 61 and the regions E1 to E4, it is hard to be affected by gases intruding from the side of the first section F1. Accordingly, the deterioration of the characteristic of the cathode 645 is reduced, and thus, it becomes possible to improve the reliability of the head unit 10.

FIG. 19 is a sectional view illustrating another example of a section of the head unit 10, taken along the line II—II of FIG. 17. This example is different from the example of FIG. 18 in that the arrangement of the power line Ls and power line Ld is reversed. That is, the power line Ls to which the cathode 645 is connected is arranged at a position further apart from the second section F2 than the power line Ld. In this case, the power line Ld is connected to the drain electrode 622 of the driving transistor 62 via the gate wiring line. With this arrangement, it is hard for the cathode 645 to be affected by gases intruding from the side of the second section F2. Accordingly, the deterioration of the characteristic of the cathode 645 is reduced, and thus, it becomes possible to improve the reliability of the head unit 10.

Image Forming Apparatus

Figure 8:
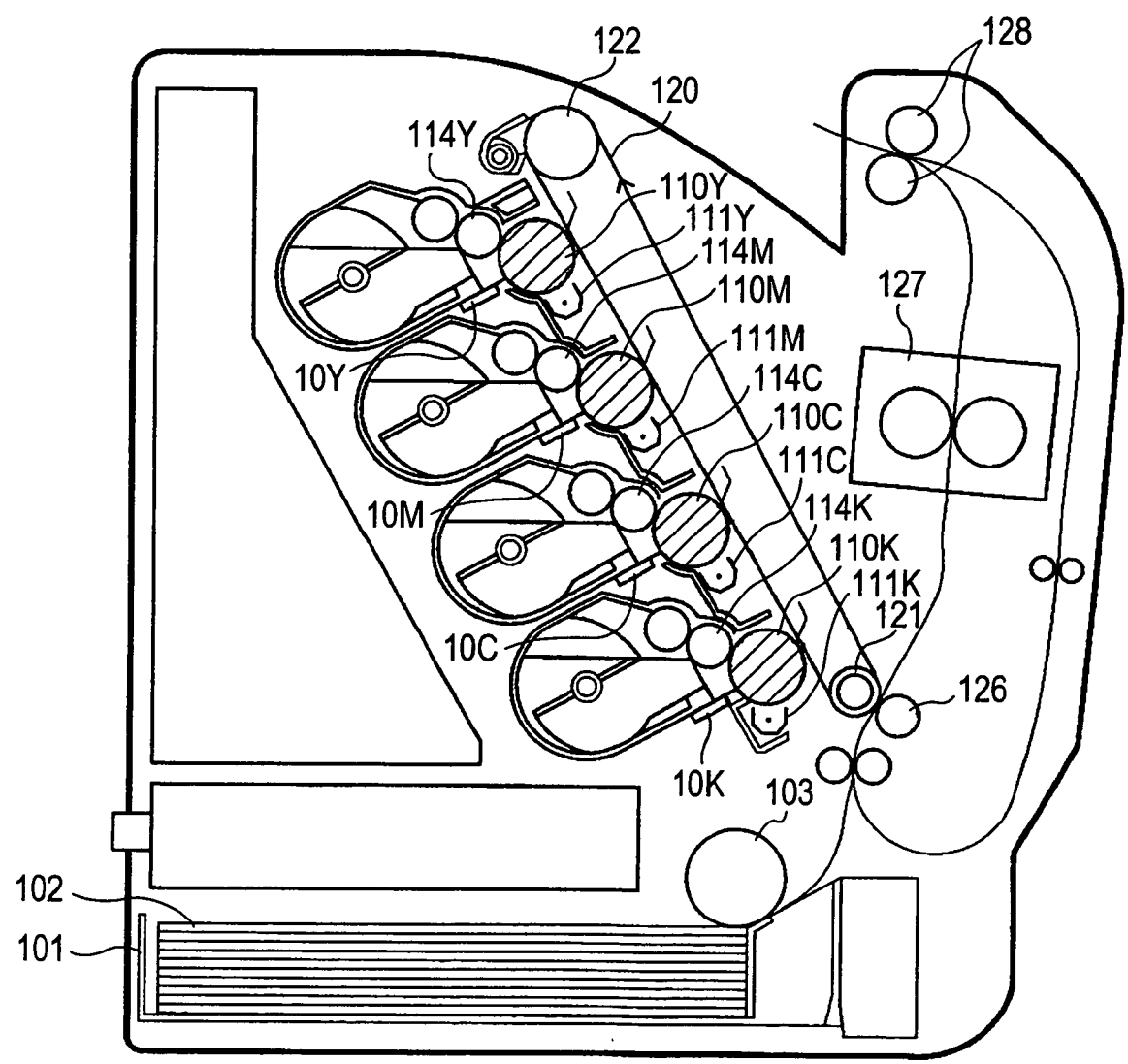
FIG. 8 is a longitudinal side view illustrating an example of an image forming apparatus.

FIG. 8 is a longitudinal side view illustrating an example of an image forming apparatus using the above-described head unit 10. This image forming apparatus is a tandem type image forming apparatus where 4 organic EL array exposure heads 10K, 10C, 10M and 10Y having the same configuration are arranged at exposure positions of 4 corresponding photoreceptors (image carriers) 110K, 110C, 110M, and 110Y having the same configuration. The organic EL array exposure heads 10K, 10C, 10M and 10Y are configured by the above-described head unit 10.

As shown in FIG. 8, the image forming apparatus is equipped with a driving roller 121, an idle roller 122, and an intermediate transfer belt 120 driven cyclically in an arrow direction shown in the figure. The photoreceptors 110K, 110C, 110M, and 110Y having photosensitive layers on their circumferences as four image carriers arranged with a preset interval in respect to the intermediate transfer belt 120 are arranged. K, C, M, and Y appended to the numerals means black, cyan, magenta, and yellow, respectively, and are used to represent black, cyan, magenta, and yellow photoreceptors, respectively. This is true of other members. The photoreceptors 110K, 110C, 110M, and 110Y are rotated in synchronization with the driving of the intermediate transfer belt 120.

Around the photoreceptors 110 (K, C, M, and Y) are respectively arranged charging means (corona chargers) 111 (K, C, M, and Y) for charging the circumferences of the photoreceptors 110(K, C, M, and Y) equally, and the above-described organic EL array exposure heads 10 (K, C, M, and Y) for line-scanning in turn the circumferences equally charged by the charging means 111 (K, C, M, and Y) in synchronization with the rotation of the photoreceptors 110 (K, C, M, and Y).

In addition, around the photoreceptors 110 (K, C, M, and Y) are further arranged developing devices 114 (K, C, M, and Y) for forming visible images (toner images) by giving toners as developing agents to electrostatic latent images formed by the organic EL array exposure heads 10 (K, C, M, and Y).

Here, the organic EL array exposure heads 10 (K, C, M, and Y) are arranged such that an array direction of the organic EL array exposure heads 10 (K, C, M, and Y) follows a generatrix of the photoreceptors 110 (K, C, M, and Y). In addition, a light emission energy peak wavelength of the organic EL array exposure head 10 (K, C, M, and Y) is set to be substantially equal to a sensitivity peak wavelength of the photoreceptors 110 (K, C, M, and Y).

The developing devices 114 (K, C, M, and Y) use, for example, nonmagnetic one-component toners as the developing agent. The nonmagnetic one-component toners are conveyed from, for example, a supply roller to a developing roller and the film thickness of the developing agent attached to a surface of the developing roller is restricted by a restriction blade. Then, as the developing roller contacts or presses the photoreceptors 110 (K, C, M, and Y), the toner images are formed by attaching the developing agent to the photoreceptors 110 (K, C, M, and Y) depending on a potential level of the photoreceptors 110 (K, C, M, and Y).

The toner images of black, cyan, magenta, yellow, formed by four mono toner image formation stations are primarily transferred and overlapped in turn on the intermediate transfer belt 120 to form a full color image. Record media 102 fed one by one from a feed cassette 101 are sent to a secondary transfer roller 126 by a pick up roller 103. The toner images on the intermediate transfer belt 120 are secondarily transferred on the record media 102, such as paper, in the secondary transfer roller 126, and then are fused on the record media 102 while passing through a pair of fusing rollers 127 as a fusing unit. Thereafter, the record media 102 are discharged by a pair of discharging rollers 128 to discharge trays provided in the upper portion of the image forming apparatus.

In this way, since the image forming apparatus of FIG. 8 uses the organic EL array as record means, the apparatus can be further miniaturized, as compared to a laser scan optical system.

Figure 9:
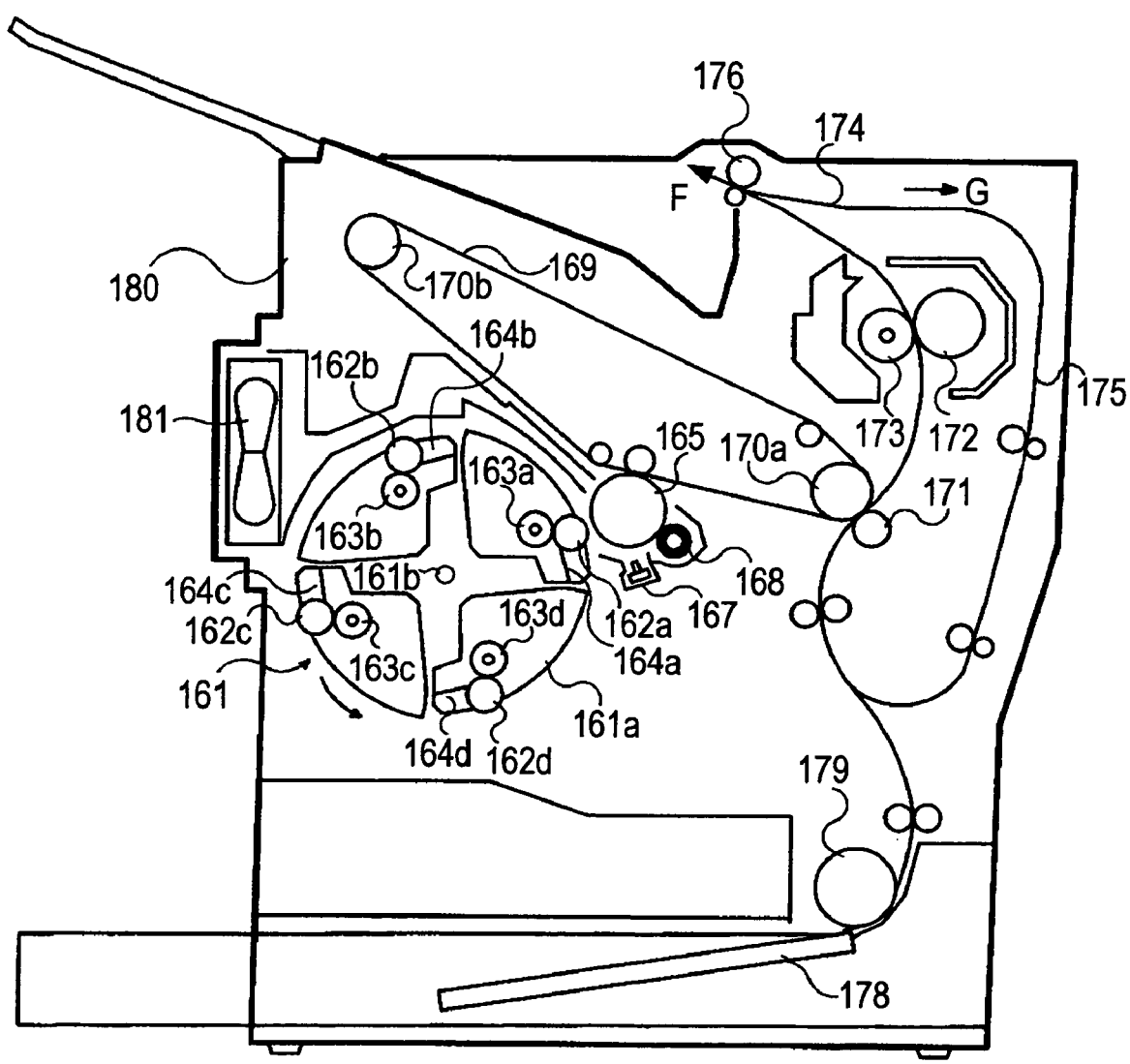
FIG. 9 is a longitudinal side view illustrating another example of an image forming apparatus.

Next, the image forming apparatus according to another embodiment of the invention will be described. FIG. 9 is a longitudinal side view of an image forming apparatus. As shown in the figure, the image forming apparatus includes, as main components, a rotary type developing device 161, a photoreceptor drum 165 serving as the image carrier, an exposure head 167 on which the organic EL array is installed, an intermediate transfer belt 169, a paper carrying path 174, a heating roller 172 of a fuser, and a feed tray 178. The exposure head 167 is configured by the above-described head unit 10.

A developing rotary 161a of the developing device 161 is counterclockwise rotated around an axis 161b. The internal of the developing rotary 161a is divided into four portions in which four yellow (Y), cyan (C), magenta (M), and black (K) color image formation units are respectively installed. Developing rollers 162a to 162d and toner supply rollers 163a to 163d are respectively arranged in the four color image formation units. In addition, the toners are restricted to a preset thickness by restriction blades 164a to 164d.

The photoreceptor drum 165 is charged by a charger 168 and is driven in a direction opposite to the developing roller 162a by a driving motor (not shown), for example, a step motor. The intermediate transfer belt 169 is installed between an idle roller 170b and a driving roller 170a. The driving roller 170a is connected to the driving motor of the photoreceptor drum 165 and transfers power to the intermediate transfer belt. The driving roller 170a of the intermediate transfer belt 169 is rotated in a direction opposite to the photoreceptor drum 165 by the driving of the driving motor.

On the paper carrying path 174 are placed a plurality of carrying rollers and a pair of discharging rollers 176 for carrying papers. One side image (toner image) carried on the intermediate transfer belt 169 is transferred on one side of a paper at a position of the secondary transfer roller 171. The secondary transfer roller 171, which faces with the intermediate transfer belt 169 with a gap therebetween by a clutch, contacts with the intermediate transfer belt 169 when the clutch is turned on, transferring an image on the paper.

Next, the paper having the image transferred thereon is fused by the fuser having a fusing heater. The fuser is equipped with a heating roller 172 and a pressing roller 173. The fused paper is pulled in the discharging rollers 176 and is traveled in an arrow direction F. Under this condition, when the pair of discharging rollers 176 is rotated in a reverse direction, the traveling direction of paper is reversed and then the paper is traveled in an arrow direction G along a carrying path 175 for double-sided print. The paper is drawn out of the feed tray 178 one by one by a pick up roller 179.

In the paper carrying path, for example, a low speed brushless motor is used as the driving motor for driving the carrying roller. In addition, for a required color difference correction, a step motor is used as the intermediate transfer belt 169. These motors are controlled by signals from control means (not shown).

In the state shown in the figure, a yellow (Y) electrostatic latent image is formed on the photoreceptor drum 165, and then, a yellow image is formed on the photoreceptor drum 165 by applying a high voltage to a developing roller 128a. When both of front and rear side yellow images are carried on the intermediate transfer belt 169, the developing rotary 161a is rotated by an angle of 90 degrees.

The intermediate transfer belt 169 is returned to a position of the photoreceptor drum 165 whenever the intermediate transfer belt 169 is rotated one time. Next, double-sided cyan (C) images are formed on the photoreceptor drum 165 and then are carried on the intermediate transfer belt 169 with an overlap with the yellow images that have already carried on the intermediate transfer belt 169. After this, in a similar manner, 90 degrees rotation of the developing rotary 161, carrying of image on the intermediate transfer belt 169, and then one rotation of the developing rotary 161a are repeated.

For carrying of four color images, the intermediate transfer belt 169 are rotated four times, and thereafter, a rotational position thereof is controlled and the image is transferred on the paper at a position of the second transfer roller 171. The paper fed from a paper feed tray 178 is carried to the carrying path 174 and the color image is transferred on one side of the paper at the position of the secondary transfer roller 171. The paper having the image transferred on its one side is reversed by the pair of paper discharging rollers 176 and waits on the carrying path. Thereafter, the paper is carried to the position of the secondary transfer roller 171 at a proper timing, and then the color image is transferred on the other side of the paper. An exhaust fan 181 is installed in a housing 180.

Display Apparatus

Next, an application of the light-emitting device 10 to a display apparatus will be described.

Figure 10:
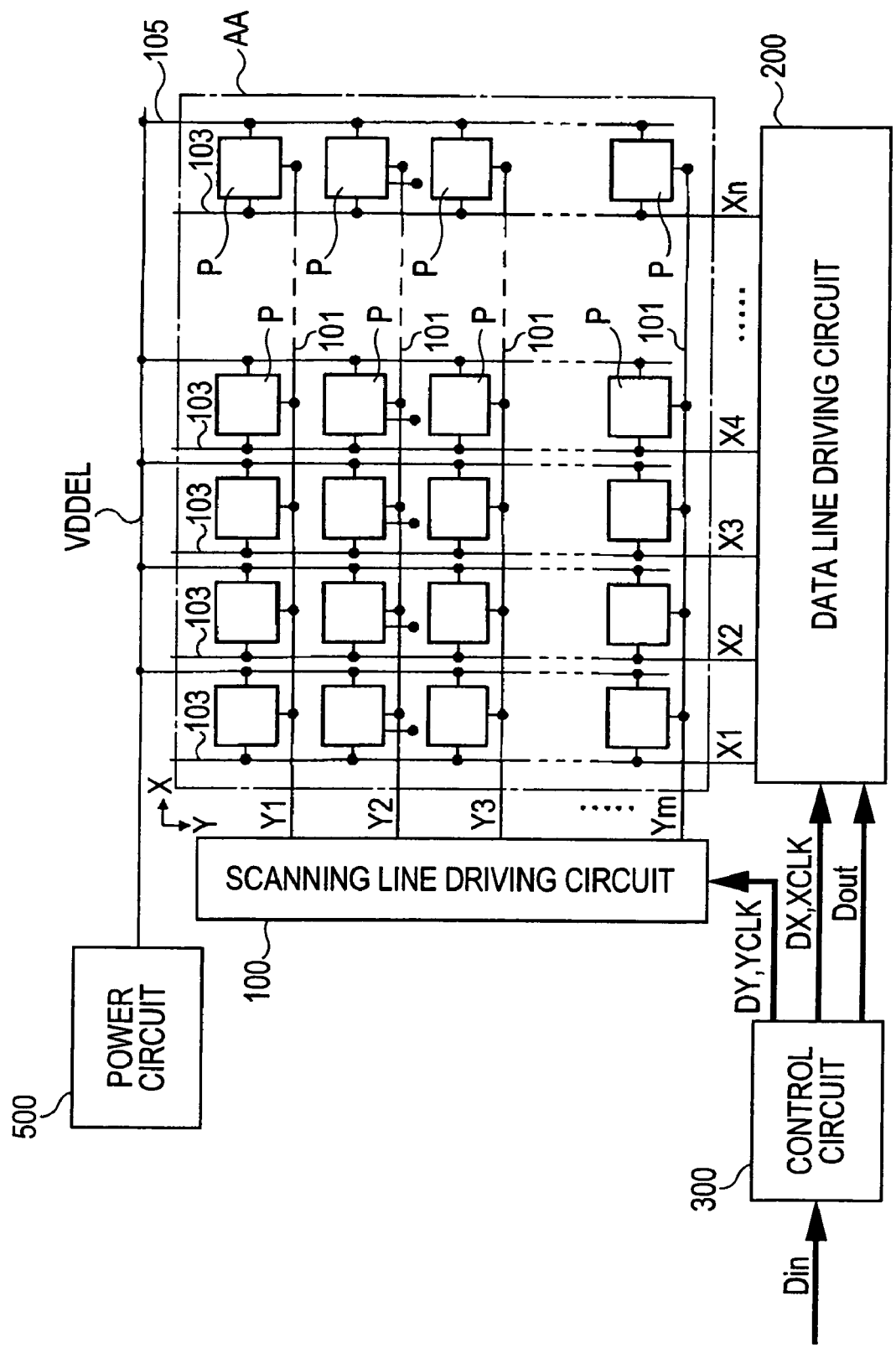
FIG. 10 is a block diagram illustrating the configuration of a display apparatus.

FIG. 10 is a block diagram illustrating the configuration of a display apparatus. The display apparatus includes a pixel region AA, a scanning line driving circuit 100, a data line driving circuit 200, a control circuit 300, and a power circuit 500. On the pixel region AA are formed m scanning lines 101 in parallel to an X direction shown in the figure. In addition, on the pixel region AA are formed n data lines 103 in parallel to a Y direction perpendicular to the X direction. In addition, pixel circuits P are formed at intersections of the scanning lines 101 and the data lines 103. Each pixel circuit P is supplied with a power supply voltage VDDEL via a power line 105. A circuit configuration of each pixel circuit P is as shown in FIG. 4. In addition, the pixel circuits P are supplied with scanning signals Y1 to Ym instead of the selection signals SEL1 to SEL40, and gray-scale signals X1 to Xn instead of the data signals D0 to D127.

The scanning line driving circuit 100 generates the scanning signals Y1, Y2, Y3, . . . , and Ym for selecting the plurality of scanning lines 101 in turn. The scanning lines Y1 to Ym are generated by transmitting a Y transmission start pulse DY in turn in synchronization with a Y clock signal YCLK.

The data line driving circuit 200 supplies the gray-scale signals X1, X2, X3, . . . , and Xn to pixel circuits P located on a selected scanning line 101, respectively, based on output gray-scale data Dout. In this example, the gray-scale signals X1 to Xn are given as voltage signals indicating gray-scale brightness.

The control circuit 300 generates various control signals such as the Y clock signal YCLK, an X clock signal XCLK, an X transmission start pulse DX, and the Y transmission start pulse DY and outputs these control signals to the scanning line driving circuit 100 and the data line driving circuit 200. In addition, the control circuit 300 generates the output gray-scale data Dout by performing an image process, such as gamma correction, for input gray-scale data Din from the outside.

Figure 11:
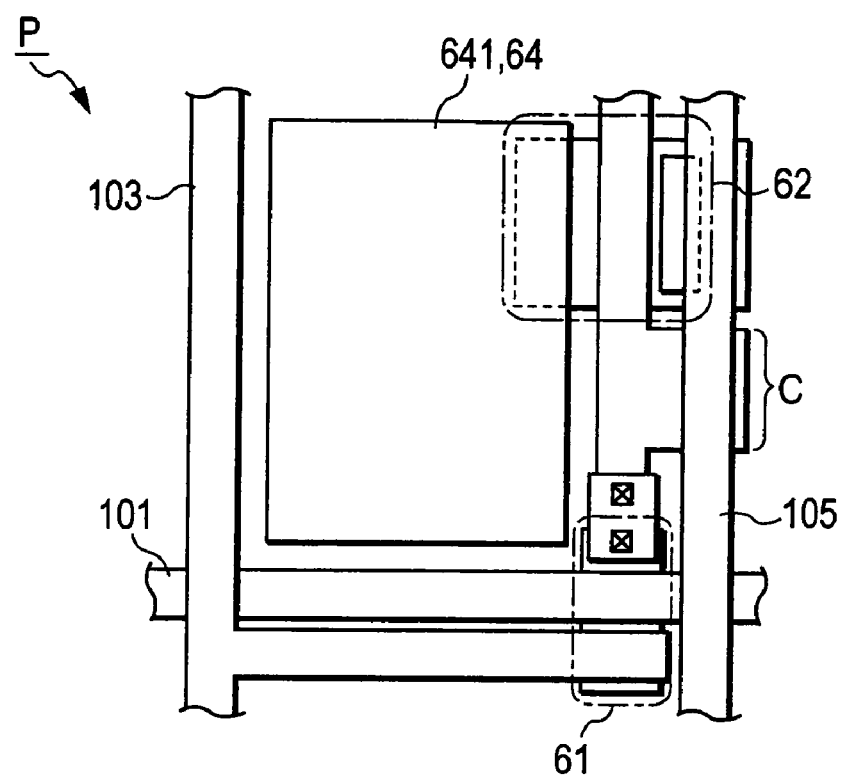
FIG. 11 is a plan view of a wiring line structure of a pixel circuit P in the display apparatus of FIG. 10.

FIG. 11 shows a wiring line structure of one pixel circuit P. As shown in the figure, the holding transistor 61 is formed at a corner in the right lower side of the figure and the driving transistor 62 is formed at a corner in the right upper side of the figure. In addition, the storage capacitance C is formed between the power line 105 and the gate wiring line. In this example, the drain electrode of the driving transistor 62 and the anode 641 of the OLED element 64 are integrally formed.

Figure 12:
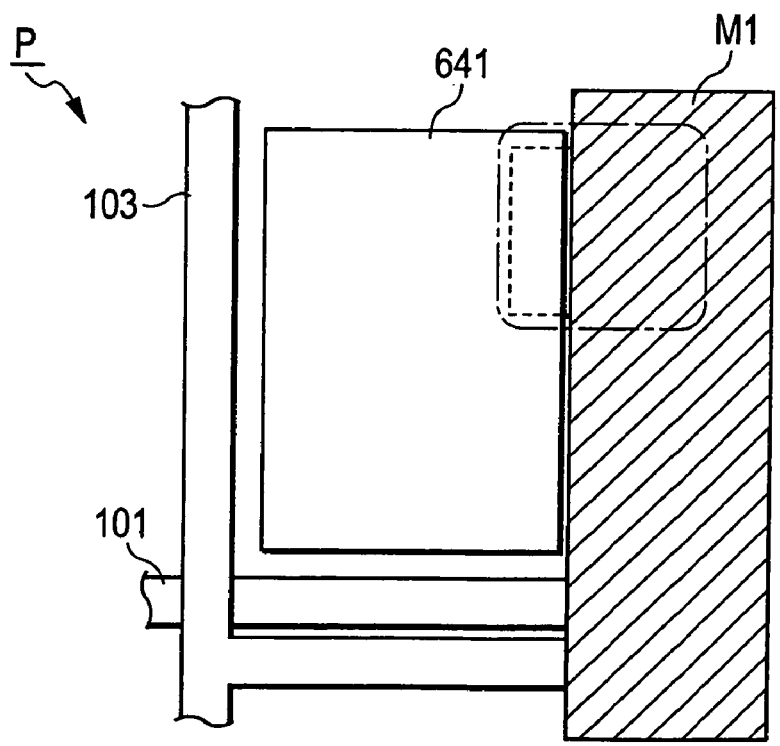
FIG. 12 is an explanatory diagram illustrating a first process of forming a cathode of the display apparatus of FIG. 10.
Figure 13:
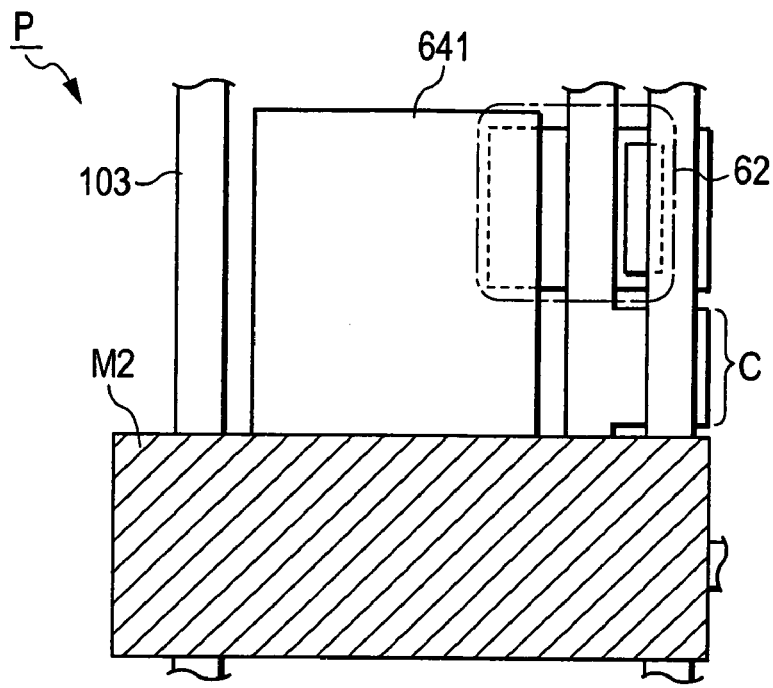
FIG. 13 is an explanatory diagram illustrating a second process of forming a cathode of the display apparatus of FIG. 10.
Figure 14:
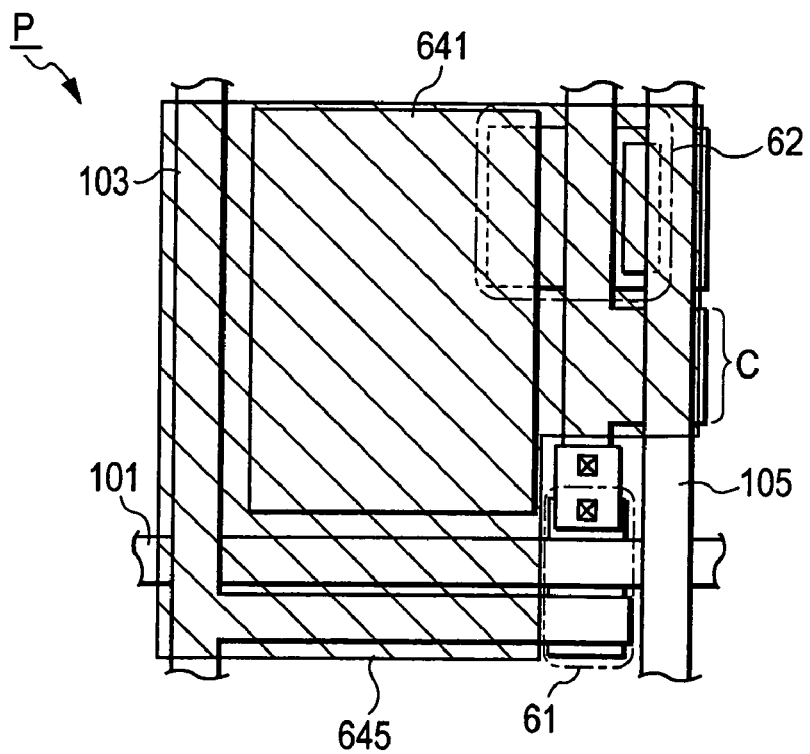
FIG. 14 is an explanatory diagram illustrating an example of an arrangement of the cathode.

In the above wiring line arrangement, the cathode 645 of the OLED element 64 is formed in the following processes. In a first process, the cathode 645 is deposited using a mask M1 shown in FIG. 12. In a second process, the cathode 645 is deposited using a mask M2 shown in FIG. 13. Forming the cathode 645 using the two deposition processes is for simplifying a shape of the masks M1 and M2 and a decision on their positions. As a result, as shown in FIG. 14, the cathode 645 is formed in a region except for the holding transistor 61. Accordingly, the stray capacitance of the holding transistor 61 is reduced, and thus, the load when viewed from the data line driving circuit 200 can be reduced.

Figure 15:
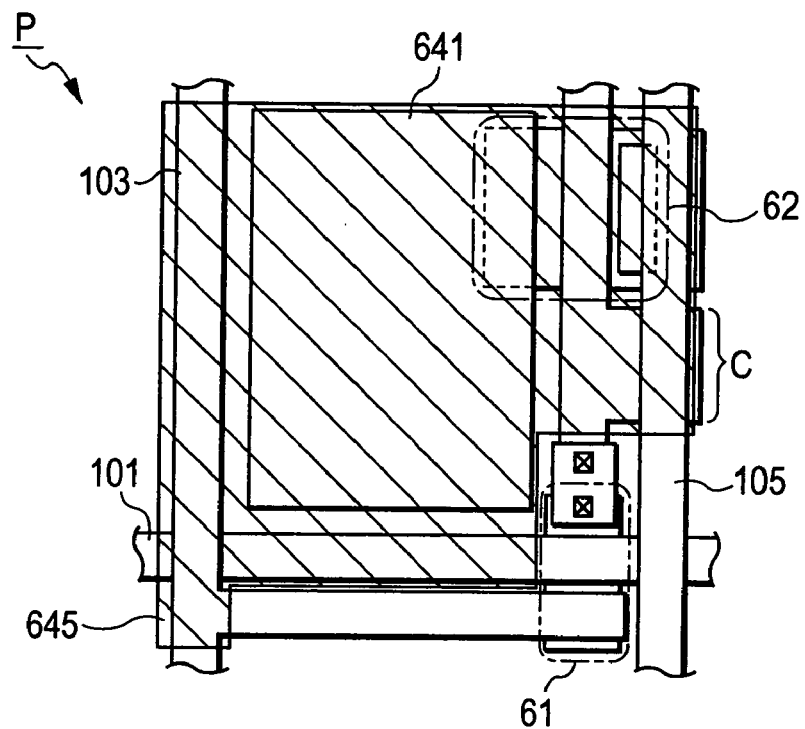
FIG. 15 is an explanatory diagram illustrating another example of an arrangement of the cathode.
Figure 16:
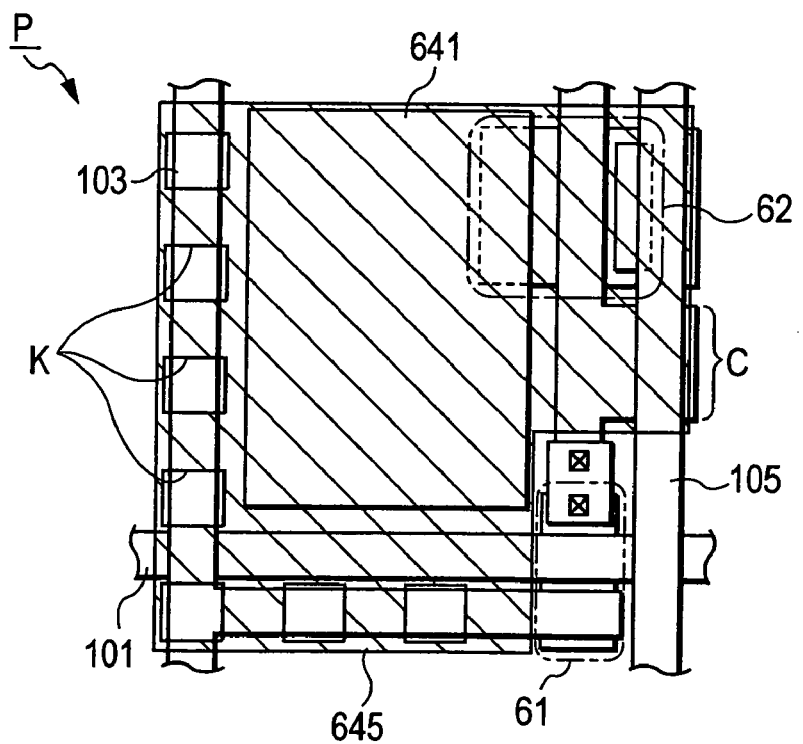
FIG. 16 is an explanatory diagram illustrating still another example of an arrangement of the cathode.

In this example, the data line 103 is covered with the cathode 645. This is for making a potential of the cathode 645 of each pixel circuit P equal. However, as shown in FIG. 15, it may be such configured that a drawn portion 103a of the data line 103 does not overlap with the cathode 645. In addition, as shown in FIG. 16, regions K in which the cathode 645 does not overlap with the data line 103 may be formed along the data line 103. As shown in FIGS. 15 and 16, by employing the structure where the portion of the data line 103 does not overlap with the cathode 645, the load when viewed from the data line driving circuit 200 can be further reduced.

Further, the electronic equipments using the display apparatus of the invention may include may include portable telephones, personal computers, personal digital assistants, digital still cameras, television monitors, view finder type or monitor direct-view type video tape recorders, car navigators, pagers, electronic organizers, calculators, word processors, workstations, video telephones, point-of-sale (POS) terminals, apparatuses equipped with touch panels, etc. In addition, the above-described display apparatus may be applied as display units of these electronic equipments.

What is claimed is:

1. A light-emitting device comprising:
a plurality of data lines; and
a plurality of pixel circuits,
wherein each of the plurality of pixel circuits includes:
a light-emitting element that has a first electrode and a second electrode and that emits light having an intensity depending on the amount of a driving current;
a driving transistor that supplies the driving current to the first electrode;
a holding transistor that supplies a driving signal supplied via the data lines to the driving transistor; and
a connecting line that connects the driving transistor to the holding transistor, and
wherein the second electrode is formed in a region different from a region in which the data lines are formed such that the second electrode is not opposite to at least one of the data lines.

2. A light-emitting device comprising:
a plurality of data lines; and
a plurality of pixel circuits,
wherein each of the plurality of pixel circuits includes:
a light-emitting element that has a first electrode and a second electrode and that emits light having an intensity depending on the amount of a driving current;
a driving transistor that supplies the driving current to the first electrode;
a holding transistor that supplies a driving signal supplied via the data lines to the driving transistor; and
a connecting line that connects the driving transistor to the holding transistor, and
wherein the second electrode is formed in a region different from a region in which the holding transistor is formed such that the second electrode is not opposite to the holding transistor.

3. The light-emitting device according to claim 1, wherein the second electrode is formed to be opposite to at least one of the connecting lines.

4. The light-emitting device according to claim 3, wherein a resistor element is formed in at least one of the connecting lines, and wherein the second electrode is formed such that the second electrode is opposite to at least one of the connecting lines with resistor element and is not opposite to the resistor element.

5. The light-emitting device according to claim 1, wherein the first electrode is an anode of the light-emitting element and the second electrode is a cathode of the light-emitting element.

6. The light-emitting device according to claim 1, further comprising:
a power line that supplies power to the driving transistor;
a substrate that has a first section and a second section between which the plurality of data lines, the holding transistor, the light-emitting element, the driving transistor, and the power line are formed in order; and
a sealing member that is connected to the substrate to cover the plurality of data lines, the holding transistor, the light-emitting element, the driving transistor, and the power line.

7. The light-emitting device according to claim 1, wherein the first electrode is an anode of the light-emitting element and the second electrode is a cathode of the light-emitting element, and
the light-emitting device further comprising:
a first power line that supplies a low potential-side power to the cathode;
a second power line that supplies a high potential-side power to the driving transistor;
a substrate that has a first section and a second section between which the plurality of data lines, the holding transistor, the light-emitting element, the driving transistor, and the first and second power lines are formed in order; and
a sealing member that is connected to the substrate to cover the plurality of data lines, the holding transistor, the light-emitting element, the driving transistor, and the first and second power lines.

8. An image forming apparatus comprising:
a photoreceptor on which an image is formed by irradiating light; and
a head unit that forms the image by irradiating light on the photoreceptor,
wherein the light-emitting device according to claims 1 is used in the head unit.

9. A display apparatus comprising the light-emitting device according to claim 1.

* * * * *